United States Patent [19]

Yu et al.

[11] Patent Number: 5,354,490
[45] Date of Patent: Oct. 11, 1994

[54] SLURRIES FOR CHEMICAL MECHANICALLY POLISHING COPPER CONTAINING METAL LAYERS

[75] Inventors: Chris C. Yu; Trung T. Doan, both of Boise, Id.

[73] Assignee: Micron Technology, Inc., Boise, Id.

[21] Appl. No.: 38,460

[22] Filed: Mar. 29, 1993

Related U.S. Application Data

[62] Division of Ser. No. 893,448, Jun. 4, 1992, Pat. No. 5,225,034.

[51] Int. Cl.$^5$ ............................................. C09K 13/00
[52] U.S. Cl. .................................... 252/79.1; 252/79.2
[58] Field of Search ...................... 252/79.2, 79.4, 79.1

[56] References Cited

U.S. PATENT DOCUMENTS

| | | | |
|---|---|---|---|
| 3,436,259 | 1/1969 | Regh | 437/930 |
| 3,691,694 | 9/1972 | Goetz et al. | 51/118 |
| 3,948,703 | 4/1976 | Kushibe | 156/666 |
| 4,029,531 | 6/1977 | Marinelli | 437/68 |
| 4,270,932 | 6/1981 | Perovetz et al. | 252/105 |
| 4,305,779 | 12/1981 | Steeves et al. | 156/636 |
| 4,395,302 | 7/1983 | Courduvelis | 156/642 |
| 4,632,727 | 12/1986 | Nelson | 156/656 |
| 4,925,491 | 5/1990 | Perovetz et al. | 106/3 |
| 4,944,836 | 7/1990 | Beyer et al. | 156/645 |
| 4,956,313 | 9/1990 | Cote et al. | 437/203 |
| 5,084,071 | 1/1992 | Nenadic et al. | 51/309 |

FOREIGN PATENT DOCUMENTS 3829220 11/1989 Fed. Rep. of Germany .

OTHER PUBLICATIONS

*Metals Handbook*, 8th ed., vol. 8, American Society for Metals, 1973, pp. 130–132.
S. Gandhi, *VLSI Fabrication Principles*, John Wiley & Sons, 1983, pp. 522–526.
*SurfaceTech Review*, Rodel., vol. 1, Issue 5, Oct. 1988, pp. 1–4.

*Primary Examiner*—Brian E. Hearn
*Assistant Examiner*—Kevin M. Picardat
*Attorney, Agent, or Firm*—Wells, St. John, Roberts, Gregory & Matkin

[57] ABSTRACT

A semiconductor processing method of chemical mechanical polishing a predominately copper containing metal layer on a semiconductor substrate includes, a) providing a chemical mechanical polishing slurry comprising $H_2O$, a solid abrasive material, and a third component selected from the group consisting of $HNO_3$, $H_2SO_4$, and $AgNO_3$ or mixtures thereof; and b) chemical mechanical polishing a predominately copper containing metal layer on a semiconductor substrate with the slurry. Such slurry also constitutes part of the invention. Such slurry may also contain an additional oxidant selected from the group consisting of $H_2O_2$, HOCl, KOCl, $KMnO_4$ and $CH_3COOH$ or mixtures thereof to form a copper oxide passivating-type layer at the copper surface.

4 Claims, No Drawings

SLURRIES FOR CHEMICAL MECHANICALLY POLISHING COPPER CONTAINING METAL LAYERS

RELATED PATENT DATA

This patent resulted from a divisional application of U.S. patent application Ser. No. 07/893,448, filed Jun. 4, 1992, which is now U.S. Pat. No. 5,225,034.

TECHNICAL FIELD

This invention relates to methods of chemical mechanical polishing copper containing metal layers in semiconductor processing, and chemical mechanical polishing slurries used therefore.

BACKGROUND OF THE INVENTION

Metal films are utilized in semiconductor technology to wire together various components formed on a semiconductor wafer. Metal in semiconductor processing can also be used to function as gate electrodes in MOS structures, and as electrodes in thin film capacitors. Elemental aluminum and its alloys have been the traditional metals utilized. Advantages of aluminum include its low resistivity, superior adhesion to $SiO_2$, ease of patterning, and high purity.

However, aluminum is not without drawbacks. First, the electrical contact of aluminum with silicon while adequate for large scale integration (LSI) level technology, has reached its limit in the very large scale integration (VLSI) era. Another drawback associated with aluminum is electromigration. This is a phenomenon that occurs in aluminum metal leads while the circuit is in operation, as opposed to a failure occurring during fabrication. Electromigration is caused by the diffusion of the aluminum in the electric field set up in the lead while the circuit is in operation. It is also enhanced by thermal gradients that arise in the lead from the heat generated by the flowing current. The metal thins and eventually separates completely, causing an opening in the circuit. Electromigration occurs over time and may not show up until a device has had many hours of operation. This problem is presently overcome by designing wide overlap regions at contacts, using a constant film thickness, or alloying aluminum with other materials such as copper or silicon.

Electromigration becomes more of a worry as the level of integration increases. The higher number of circuit components in VLSI, ultra large scale integration (ULSI) and beyond creates more current flow and generates more heat. Accordingly, as integrated circuit patterning schemes continue to miniaturize into to submicron dimensions, aluminum-based metallurgies will become increasingly marginal for handling the increased circuit speed and current density requirements.

Elemental copper or its alloys would be an attractive alternative as the primary conductor in VLSI and ULSI multilevel metallization systems. Copper has an even lower resistivity than aluminum, and significantly higher electromigration resistance. However, a primary problem with integrating copper metal into multilevel metallization systems is the difficulty of patterning the metal using etching techniques. For devices of submicron minimum feature size, wet etch techniques for copper patterning have not been acceptable due to, a) liquid surface tension, b) isotropic etch profile, and c) difficulty in over-etch control.

Several promising methods for producing patterned predominately Cu interconnects have been proposed, including selective electroless plating, selective chemical vapor depositing, and high temperature reactive ion etching. Lift off processing is also another alternative for patterning copper. One alternate technique of metal wiring of copper, and in accordance with an aspect of the invention, would comprise the patterning and etching of a trough and/or contact within a thick layer of insulating material such as $SiO_2$. Thereafter, a thin layer of a barrier metal, such as Ti, TiW or TiN, is provided atop the insulating layer and within the trough and/or contact. Such functions as a diffusion barrier to prevent inter-diffusion between the metal to be subsequently deposited and silicon, and between such metal and oxide. After barrier metal deposition, a layer of metal is deposited to completely fill the trough. With troughs, which would be created prior to metal deposition, a desired metal pattern is defined such that a planar metal removing technique down to the surface of the insulating layer will leave remaining desired patterned electrically conductive metal lines.

One such planarizing technique is chemical mechanical polishing. However to date, chemical mechanical polishing of copper and it alloys has not been well understood or developed. Accordingly, a need remains for improved chemical mechanical polishing techniques and chemical mechanical polishing slurries for copper and its alloys.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of chemical mechanical polishing a predominately copper containing metal layer on a semiconductor substrate comprises the following steps:

providing a chemical mechanical polishing slurry comprising $H_2O$, a solid abrasive material, and a third component selected from the group consisting of $HNO_3$, $H_2SO_4$, and $AgNO_3$ or mixtures thereof; and chemical mechanical polishing a predominately copper containing metal layer on a semiconductor substrate with the slurry.

If utilizing $HNO_3$ alone, the preferred composition is from about 4% to about 20% by volume, with from about 4% to about 8% by volume being most preferred. If utilizing $H_2SO_4$ alone, the preferred composition is from about 2% to about 10% by volume, with from about 2% to about 5% by volume being most preferred. If utilizing $AgNO_3$ alone, the preferred composition is from about 2% to about 15% by volume, with from about 2% to about 8% by volume being most preferred. Such slurries comprise another aspect of the invention.

The expected mechanisms by which the respective chemical reactions will occur in a chemical mechanical polishing process are as follows:

$$3\,Cu(s) + 8[H^+(aq) + NO_3^-(aq)] \longrightarrow 3[Cu^{++}(aq) + 2NO_3^-(aq)] + 2NO(g) + 4H_2O(l)$$

-continued

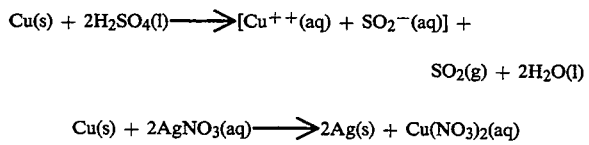

$$Cu(s) + 2AgNO_3(aq) \longrightarrow 2Ag(s) + Cu(NO_3)_2(aq)$$

All of the above reactions convert, at the copper containing metal surface, a solid copper film or a solid copper alloy film into an aqueous phase. With the combined effect of chemical reaction and mechanical polishing, a predominately copper film can be polished with a high degree of planarity. A purely chemical wet etch rate using the above acids would be considerably lower and impractical. However, the described and claimed CMP process increases the effective surface temperature of the wafer where reaction takes place due the friction from mechanical action. Such higher temperature provides a desired high and controllable reaction rate otherwise not achievable. Further, the mechanical aspect in a CMP process speeds up the removal of reaction product from the film surface, and hence also increases reaction rate.

In the case of $AgNO_3$, Ag may precipitate from the slurry upon reaction between $AgNO_3$ and copper. The precipitated Ag can be brushed off the polishing pad periodically by a brusher. Also, with Ag being a ductile material, a good post copper chemical mechanical polishing cleaning step may be required to remove Ag particles from the wafer surface.

If desired, to further increase the polishing rate, a second oxidizing agent such as $H_2O_2$, HOCl, KOCl, $KMnO_4$, $CH_3COOH$ or others could be added. The role of this second oxidizing agent would be to form a copper oxide. The copper oxide would be subsequently removed by the mechanical polishing of the CMP action, such that the addition of the second oxidizing agent can increase the mechanical polishing component of the CMP process. For $H_2O_2$ and $CH_3COOH$, the preferred respective concentrations are from about 2% to about 25%, with from about 4% to about 10% being most preferred. For HOCl, KOCl and $KMnO_4$, the preferred respective concentrations are from about 1% to about 15%, with from about 3% to about 8% being most preferred. Also, any suitable chemical mechanical polishing abrasive particles could be utilized in the slurry, such as alumina, silica or titanium oxide. In addition to mechanically polishing off the formed copper oxide, a chemical such as acids, KOH or $NH_4OH$ can also be added to increase the removal rate of copper oxide via surface chemical reaction.

In a preferred process in accordance with the invention, contact/vias and interconnect troughs would first be etched into $SiO_2$, typically using a reactive ion etch. Thereafter, a barrier layer of Ti, TiN or TiW would be provided, such as by using a sputtering or chemical vapor deposition technique. Thereafter, a copper or copper alloy layer would be deposited, such as by chemical vapor deposition, sputtering, electroless deposition, or electrodeposition. One of the subject slurries would then be utilized to chemically mechanically polish the copper containing layer and barrier metal layer composite in a single step.

One of the prior art problems associated with copper etching is the requirement of very high acid concentrations to achieve the desired etch. With the above described process and slurries, the concentration of the acid is reduced over what has been required in the prior art, and high polishing rates can be achieved in a comparatively mild slurry enabling better controllability and repeatable results. The use of an oxidizer can effectively increase the strength of the copper chemical mechanical polishing process by forming a copper oxide passivating layer at the copper surface. Since the chemical etch rate of copper oxide can be lower than that of copper in a copper chemical mechanical polishing slurry, the process may more heavily rely on the mechanical polishing to remove copper oxide, resulting in a higher degree of planarity. The above described preferred process as well enables copper interconnects and wiring to be directly formed without the need of a difficult copper etch.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A chemical mechanical polishing slurry comprising:
   a liquid semiconductor processing chemical-mechanical polishing slurry having suspended solids, the slurry comprising $AgNO_3$ at from about 2% to 15% by volume, $H_2O_2$, $H_2O$, and the suspended solids comprising a solid abrasive material.

2. A chemical mechanical polishing slurry comprising:
   a liquid semiconductor processing chemical-mechanical polishing slurry having suspended solids, the slurry comprising $AgNO_3$ at from about 2% to 15% by volume, HOCl, $H_2O$, and the suspended solids comprising a solid abrasive material.

3. A chemical mechanical polishing slurry comprising:
   a liquid semiconductor processing chemical-mechanical polishing slurry having suspended solids, the slurry comprising $AgNO_3$ at from about 2% to 15% by volume, KOCl, $H_2O$, and the suspended solids comprising a solid abrasive material.

4. A chemical mechanical polishing slurry comprising:
   a liquid semiconductor processing chemical-mechanical polishing slurry having suspended solids, the slurry comprising $AgNO_3$ at from about 2% to 15% by volume, $KMnO_4$, $H_2O$, and the suspended solids comprising a solid abrasive material.

* * * * *